United States Patent
Ogata et al.

(10) Patent No.: US 6,787,284 B2
(45) Date of Patent: Sep. 7, 2004

(54) POSITIVE RESIST COMPOSITION AND BASE MATERIAL CARRYING LAYER OF THE POSITIVE RESIST COMPOSITION

(75) Inventors: Toshiyuki Ogata, Kanagawa (JP); Koutaro Endo, Kanagawa (JP); Hiroshi Komano, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 157 days.

(21) Appl. No.: 09/922,723

(22) Filed: Aug. 7, 2001

(65) Prior Publication Data

US 2002/0025495 A1 Feb. 28, 2002

(30) Foreign Application Priority Data

Aug. 9, 2000 (JP) ........................................ 2000-240871

(51) Int. Cl.$^7$ .......................... G03C 1/73; G03C 1/795; G03F 7/039; G03F 7/075; G03F 7/09
(52) U.S. Cl. .................. 430/270.1; 430/326; 430/271.1; 430/272.1; 430/905; 430/914
(58) Field of Search .............................. 430/270.1, 326, 430/271.1, 272.1, 905, 914

(56) References Cited

U.S. PATENT DOCUMENTS

| | | | | |
|---|---|---|---|---|
| 5,565,304 A | * | 10/1996 | Honda | 430/311 |
| 5,691,396 A | | 11/1997 | Takemura et al. | 522/62 |
| 5,731,126 A | | 3/1998 | Takemura et al. | 430/270.1 |
| 5,882,844 A | * | 3/1999 | Tsuchiya et al. | 430/288.1 |
| 6,630,064 B1 | * | 10/2003 | Itatani et al. | 204/489 |

FOREIGN PATENT DOCUMENTS

| | | | |
|---|---|---|---|
| JP | 4-130324 | | 5/1992 |
| JP | 2001-51422 | * | 2/2001 |

OTHER PUBLICATIONS

English translation of JP 4–130324 (Tokutake et al) provided by PTO.*
Machine–assisted English translation of JP 2001–51422 (provided by Japan Patent Office), Feb. 23, 2001.*
Chemical Structure of Trisp PA (a compound taught by Honda '304) provided by STN database.*

* cited by examiner

*Primary Examiner*—Mark F. Huff
*Assistant Examiner*—Sin J. Lee
(74) *Attorney, Agent, or Firm*—Sughrue Mion, PLLC

(57) ABSTRACT

A positive resist composition includes (A) an alkali-soluble polysiloxane resin, (B) an acid generator composed of a compound which generates an acid upon irradiation of active light or radiant ray, and (C) a compound in which at least one hydrogen atom of phenolic hydroxyl group or carboxyl group is substituted with an acid-decomposable group. This positive resist composition is useful for processes using $F_2$ excimer laser (157 nm), extreme-ultraviolet rays (EUV, vacuum ultraviolet rays; 13 nm) and other light sources having wavelengths equal to or shorter than that of KrF excimer laser, and has high definition and can form resist patterns with good sectional shapes. A base material carrying a layer of the positive resist composition is also useful.

14 Claims, No Drawings

POSITIVE RESIST COMPOSITION AND BASE MATERIAL CARRYING LAYER OF THE POSITIVE RESIST COMPOSITION

BACKGROUND OF THE INVENTION

1. Field of the Invention

The present invention relates to a positive resist composition and a base material carrying a resist layer composed of the positive resist composition.

2. Description of the Related Art

Semiconductor devices are more and more being intensified in the degree of integration in recent years. The mass production of large-scale integrated circuits (LSIs) using 0.18-μm design rules had been already launched, and the mass production of LSIs using 0.15-μm design rules was launched at the end of 2000.

In the lithography process for such semiconductors, attempts are made to put LSIs using about 0.13-μm design rules into practical use. Such attempts include the use of a chemically amplified positive or negative resist as the resist; the combination use of the chemically amplified positive or negative resist with an organic or inorganic anti-reflection coating; improvements in exposure mask such as the use of a half-tone mask and Levenson mask; and improvements in exposure equipment such as annular illumination, scanning technique, and the use of lenses with higher numerical apertures.

A silicon-containing resist is one of hopeful candidates for use in next-generation or next-to-next-generation lithography processes using 0.15-μm or shorter design rules. Such silicon-containing resists have satisfactory dry etching resistance and have been widely reported.

For example, Japanese Patent Laid-Open Nos. 8-334900, 8-334901 and 9-87391 propose chemically amplified positive resist compositions each comprising an acid generator, and a polysiloxane in which part of hydrogen atoms of hydroxyl groups in polyhydroxybenzylsilsesquioxane is protected with an acid-unstable group.

However, such binary system positive resists comprising polyhydroxybenzylsilsesquioxane having an acid-unstable group in combination with an acid generator are not satisfactory in definition and resist pattern shape and should be improved.

SUMMARY OF THE INVENTION

Accordingly, an object of the present invention is to provide a positive resist composition that is useful in processes using $F_2$ excimer laser (157 nm), extreme-ultraviolet rays (EUV, vacuum ultraviolet rays; 13 nm) and other light sources having wavelengths equal to or shorter than that of KrF excimer laser, and has high definition and can form resist patterns with good sectional shapes, as well as to provide a base material carrying a resist layer composed of the positive resist composition.

Specifically, the present invention provides, in an aspect, a positive resist composition including (A) an alkali-soluble polysiloxane resin, (B) an acid generator composed of a compound which generates an acid upon irradiation with active light or radiant ray, and (C) a compound in which at least one hydrogen atom of phenolic hydroxyl group or carboxyl group is substituted with an acid-decomposable group.

In the positive resist composition, Ingredient (A) is preferably an alkali-soluble polysiloxane resin including (a1) a siloxane unit containing an alkali-soluble group, and (a2) a siloxane unit containing an alkali-insoluble group, which alkali-insoluble group has no acid-decomposable group.

More preferably, the alkali-soluble group of the siloxane unit (a1) is at least one of hydroxyl group and carboxyl group.

In the siloxane unit (a1), the alkali-soluble group is preferably bonded to the silicon atom of a siloxane group through at least one group selected from among alkylene groups, cycloalkylene groups and aralkylene groups.

The siloxane unit (a1) is more preferably a hydroxybenzylsilsesquioxane unit.

The alkali-insoluble group having no acid-decomposable group of the siloxane unit (a2) is preferably at least one selected from among alkyl groups, cycloalkyl groups, aryl groups and aralkyl groups.

The siloxane unit (a2) is more preferably a phenylsilsesquioxane unit.

Preferably, Ingredient (C) in the positive resist composition is a compound in which at least one hydrogen atom of the hydroxyl group or carboxyl group of a compound of following Formula (I) is substituted with an acid-decomposable group, which acid-decomposable group is selected from among tertiary-alkyloxycarbonyl-substituted alkyl groups, tertiary-alkyloxycarbonyl groups, tertiary-alkyl groups, cyclic ether groups and alkoxy-substituted alkyl groups:

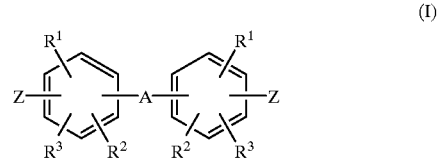

(I)

wherein Z is a hydroxyl group or a carboxyl group; each of $R^1$, $R^2$ and $R^3$ is independently a hydrogen atom, a hydroxyl group, a halogen atom, an alkoxy group having from 1 to 5 carbon atoms, or a linear, branched or cyclic alkyl group having from 1 to 6 carbon atoms; A is a single bond or a divalent organic group selected from the group consisting of alkylene groups each having from 1 to 5 carbon atoms, alkylidene groups each having from 2 to 5 carbon atoms, alkylene groups each having from 1 to 5 carbon atoms and further having a carboxyl group, alkylidene groups each having from 2 to 5 carbon atoms and further having a carboxyl group, a carbonyl group, and groups of the following formulae:

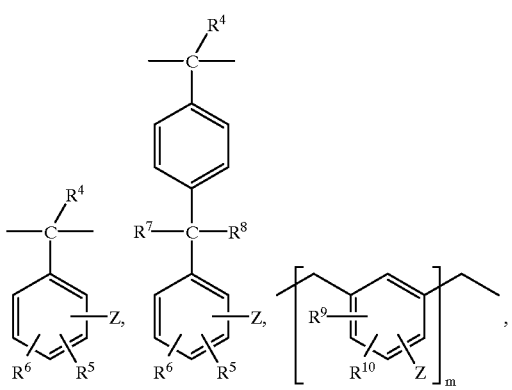

$R^4$ is a hydrogen atom or an alkyl group having from 1 to 5 carbon atoms; each of $R^5$ and $R^6$ is independently a hydrogen atom, a halogen atom, a hydroxyl group, an alkyl group having from 1 to 5 carbon atoms, or an alkoxy group having from 1 to 5 carbon atoms; each of $R^7$ and $R^8$ is independently an alkyl group having from 1 to 5 carbon atoms; each of $R^9$ and $R^{10}$ is independently a hydrogen atom, a hydroxyl group or an alkyl group having from 1 to 5 carbon atoms; and m denotes an integer from 1 to 6.

The acid-decomposable group in the positive resist composition is preferably at least one selected from among tert-butyloxycarbonylmethyl group, tert-butyloxycarbonyl group, tert-butyl group, tetrahydrofuranyl group, tetrahydropyranyl group, ethoxyethyl group and methoxypropyl group.

In another aspect, the present invention provides a base material including an organic polymer layer as a first resist layer formed on a substrate, and a second resist layer formed on the organic polymer layer, which second resist layer is composed of the positive resist composition and has a thickness of from 50 to 200 nm.

DETAILED DESCRIPTION OF THE INVENTION

Ingredient (A)

Ingredient (A) for use in the present invention is an alkali-soluble polysiloxane resin. Such alkali-soluble polysiloxane resins as Ingredients (A) are not specifically limited as far as they each have a phenolic hydroxyl group or carboxyl group which is conducive to alkali-solubility and have a siloxane skeleton which is conducive to dry etching resistance.

Among them, preferred Ingredients (A) for use in the present invention are alkali-soluble polysiloxane resins having (a1) a siloxane unit containing an alkali-soluble group and (a2) a siloxane unit containing an alkali-insoluble group, which alkali-insoluble group has no acid-decomposable group. These alkali-soluble polysiloxane resins are highly soluble in alkali in exposed portions and are highly insoluble in alkali in unexposed portions and exhibit higher contrast and satisfactory definition and can form resist patterns with good shapes.

Additionally, these alkali-soluble polysiloxane resins have improved transparency to $F_2$ excimer laser and can form resist patterns with high definition upon the use of $F_2$ excimer laser.

In the siloxane unit (a1), the alkali-soluble group (e.g., a phenolic hydroxyl group or carboxyl group) is preferably bonded to the silicon atom of the siloxane group through a divalent organic group. Such divalent organic groups include, for example, alkylene groups each having from 1 to 10 carbon atoms, cycloalkylene groups each having from 5 to 8 carbon atoms, and aralkylene groups each having from 7 to 12 carbon atoms, of which aralkylene groups are typically preferred.

As the siloxane group, a silsesquioxane unit represented by the formula: —$SiO_{3/2}$— is preferred, since the resulting resist composition can form a dense or tight film or coating and exhibits satisfactory dry etching resistance.

Examples of the siloxane units (a1) for use herein are as follows.

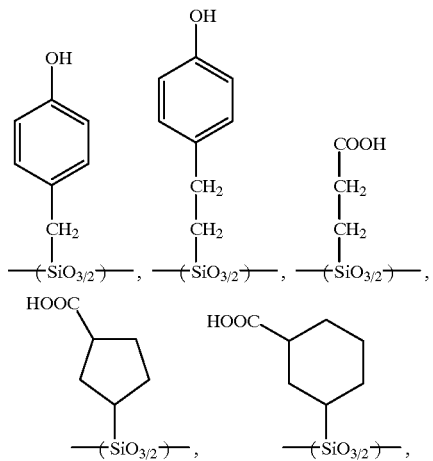

Of these siloxane units (a1), hydroxyaralkylsilsesquioxane units are preferred since they are easily available at low costs, of which hydroxybenzylsilsesquioxane unit is typically preferred.

In the siloxane unit (a2), an alkali-insoluble group having no acid-decomposable group is preferably bonded to the silicon atom of the siloxane group. Preferred alkali-insoluble groups having no acid-decomposable group include, for example, linear, branched or cyclic, substituted or unsubstituted alkyl groups each having from 1 to 10 carbon atoms, cycloalkyl groups, aryl groups, and aralkyl groups, of which aryl groups and aralkyl groups are typically preferred.

The siloxane group in the siloxane unit (a2) is preferably a silsesquioxane unit as in the unit (a1), as the resulting resist composition can form a dense or tight film and exhibits satisfactory dry etching resistance.

Examples of the siloxane units (a2) are as follows.

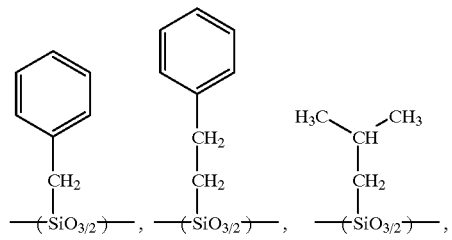

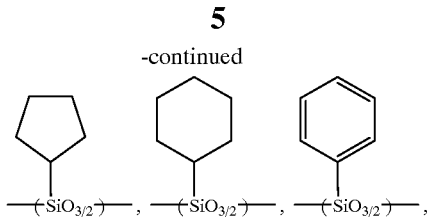

Preferred siloxane units (a2) are aralkylsilsesquioxane units and arylsilsesquioxane units, since they are easily available at low costs, of which benzylsilsesquioxane unit and phenylsilsesquioxane unit are typically preferred.

Preferred Ingredients (A) each comprise a hydroxybenzylsilsesquioxane unit as the unit (a1) in combination with a phenylsilsesquioxane unit as the unit (a2).

The molar ratio of the unit (a1) to the unit (a2) in Ingredient (A) is from 1:9 to 9:1 and preferably from 5:5 to 8:2.

Ingredients (A) for use in the present invention can be synthetically prepared, for example, according to the method described in Japanese Patent No. 2567984, as described in Preparation Example below.

Ingredient (A) has a weight average molecular weight of preferably from 1000 to 100000 and more preferably from 2000 to 20000. If the weight average molecular weight is less than 1000, the resulting resist composition is poor in film-forming property and has decreased dry etching resistance. In contrast, if it exceeds 100000, the resulting resist composition has decreased dissolution rate in alkali to thereby deteriorate definition.

The content of Ingredient (A) is preferably from 3 to 10% by weight and more preferably from 3 to 6% by weight based on the total weight of the composition. If the content of Ingredient (A) is less than 3% by weight, the resulting resist composition is poor in film-forming property and has decreased dry etching resistance. In contrast, if it exceeds 10% by weight, the film of the resist composition cannot significantly have a desired thickness.

Ingredient (B)

Ingredients (B) for use in the present invention are not specifically limited as far as they are acid generators composed of a compound which generates an acid upon irradiation with active light or radiant ray, and known or conventional acid generators can be used. Preferred acid generators are onium salts each having a fluoroalkylsulfonate ion as an anion.

Preferred cations of such onium salts are phenyliodonium or phenylsulfonium which may have a substituent. Such substituents include methyl group, ethyl group, propyl group, n-butyl group, tert-butyl group and other lower alkyl groups, and methoxy group, ethoxy group, and other lower alkoxy groups.

Preferred anions of the onium salts include fluoroalkylsulfonate ions in which part or all of the hydrogen atoms of an alkyl group having from 1 to 10 carbon atoms are fluorinated. The more carbon atoms the alkyl group has or the less amount of the hydrogen atoms is fluorinated, the less the strength as sulfonic acid is. Accordingly, typically preferred anions are fluoroalkylsulfonate ions in which all of the hydrogen atoms of an alkyl group having from 1 to 5 carbon atoms are fluorinated.

Such preferred Ingredients (B) include, for example, trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate or nonafluorobutanesulfonate of triphenylsulfonium, and trifluoromethanesulfonate or nonafluorobutanesulfonate of tri(4-methylphenyl)sulfonium. Among them, triphenylsulfonium trifluoromethanesulfonate and triphenylsulfonium nonafluorobutanesulfonate are typically preferred. Each of these Ingredients (B) can be used alone or in combination.

The proportion of Ingredient (B) is preferably from 0.1 to 20 parts by weight and more preferably from 1 to 10 parts by weight relative to 100 parts by weight of Ingredient (A). If the proportion of Ingredient (B) is less than 0.1 part by weight, the resulting resist composition cannot satisfactorily form a resist pattern. In contrast, if it exceeds 20 parts by weight, the resist composition cannot be significantly homogenous and has deteriorated storage stability.

Ingredient (C)

Ingredients (C) for use in the present invention are compounds in which at least one of the hydroxyl group of a phenolic hydroxyl group or carboxyl group is substituted with an acid-decomposable group. In these compounds, part of an alkali-soluble group such as phenolic hydroxyl group or carboxyl group is substituted with an acid-decomposable group that serves as an alkali-dissolution inhibitory group, and the resulting compounds are alkali-dissolution inhibitory compounds. However, in exposed portions, the acid-decomposable group is decomposed by catalytic reaction of an acid generated from the acid generator (B), and these compounds become alkali-soluble. They are known dissolution inhibitors for use in ternary system chemically amplified positive resists. The dissolution inhibitor can be freely selected from various proposed compounds carrying an induced acid-decomposable group, such as low molecular weight compounds having molecular weight of less than or equal to 1000, and high molecular weight compounds having a weight average molecular weight of from 2000 to 20000, including polyhydroxystyrene.

Preferred Ingredients (C) include low molecular weight compounds having a molecular weight of less than or equal to 1000 and having a phenolic hydroxyl group or carboxyl group, in which part of the hydrogen atoms of the phenolic hydroxyl group or carboxyl group is substituted with an acid-decomposable group.

Such low molecular weight compounds having a molecular weight of less than or equal to 1000 include, for example, bis(4-hydroxyphenyl)methane, bis(2,3,4-trihydroxyphenyl)methane, 2-(4-hydroxyphenyl)-2-(2'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,3,5-trimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, and 1-[1-(4-hydroxyphenyl)isopropyl]-4-[1,1-bis(4-hydroxyphenyl)ethyl]benzene;

binuclear to hexanuclear formaldehyde condensates of phenols selected from among phenol, m-cresol, p-cresol and 2,5-xylenol;
biphenylpolycarboxylic acid, naphthalene(di)carboxylic acid, naphthalenetriacetic acid, benzoylbenzoic acid, anthracenecarboxylic acid, a compound of the following formula:

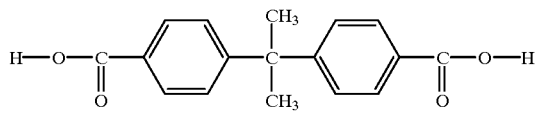

2,2'-bis(4-hydroxyphenyl)propanoic acid, 4,4'-bis(hydroxyphenyl)pentanoic acid; and
cholic acid, deoxycholic acid, ursocholic acid, lithocholic acid, and other bile acids.

The acid-decomposable group to be substituted on the low-molecular weight compound can be freely selected from among various known or conventional acid-decomposable groups. Preferred acid-decomposable groups for use in the present invention include, for example, tert-butyloxycarbonylmethyl group, tert-butyloxycarbonylethyl group, and other tertiary-alkyloxycarbonyl-substituted alkyl groups; tert-butyloxycarbonyl group, tert-amyloxycarbonyl group, and other tertiary-alkyloxycabonyl groups; tert-butyl group, tert-amyl group, and other tertiary alkyl groups; tetrahydropyranyl group, tetrahydrofuranyl group, and other cyclic ether groups; ethoxyethyl group, methoxypropyl group, and other alkoxy-substituted alkyl groups; 1-methylcyclohexyl group, 1-ethylcyclohexyl group, and other 1-lower-alkyl-substituted cycloalkyl groups; 1-methyladamantyl group, 1-ethyladamantyl group, and other 1-lower-alkyl-substituted polycycloalkyl groups.

As Ingredient (C), low molecular weight compounds as listed above are preferred, since the resulting resist composition has high definition. As the low molecular weight compounds, preferred are the compounds of following Formula (1) in which at least one hydrogen atom of the hydroxyl group or carboxyl group is substituted with an acid-decomposable group selected from among tertiary-alkyloxycarbonyl-substituted alkyl groups, tertiary-alkyloxycarbonyl groups, tertiary alkyl groups, cyclic ether groups and alkoxy-substituted alkyl groups:

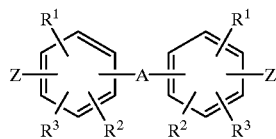

(I)

wherein Z is a hydroxyl group or a carboxyl group; each of $R^1$, $R^2$ and $R^3$ is independently a hydrogen atom, a hydroxyl group, a halogen atom, an alkoxy group having from 1 to 5 carbon atoms, or a linear, branched or cyclic alkyl group having from 1 to 6 carbon atoms; A is a single bond or a divalent organic group selected from the group consisting of alkylene groups each having from 1 to 5 carbon atoms, alkylidene groups each having from 2 to 5 carbon atoms, alkylene groups each having from 1 to 5 carbon atoms and further having a carboxyl group, alkylidene groups each having from 2 to 5 carbon atoms and further having a carboxyl group, a carbonyl group, and groups of the following formulae:

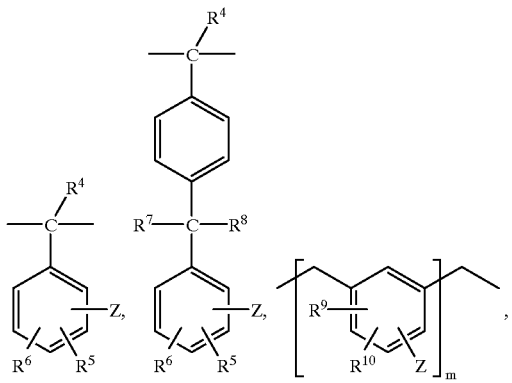

$R^4$ is a hydrogen atom or an alkyl group having from 1 to 5 carbon atoms; each of $R^5$ and $R^6$ is independently a hydrogen atom, a halogen atom, a hydroxyl group, an alkyl group having from 1 to 5 carbon atoms, or an alkoxy group having from 1 to 5 carbon atoms; each of $R^7$ and $R^8$ is independently an alkyl group having from 1 to 5 carbon atoms; each of $R^9$ and $R^{10}$ is independently a hydrogen atom, a hydroxyl group or an alkyl group having from 1 to 5 carbon atoms; and m denotes an integer from 1 to 6.

Examples of these compounds include the following compounds (C-1) to (C-14).

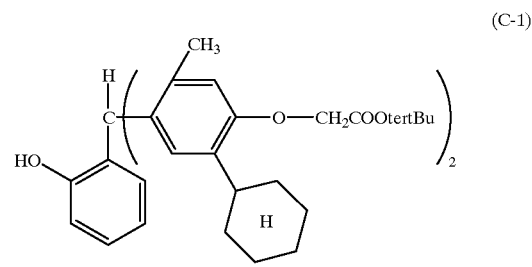

(C-1)

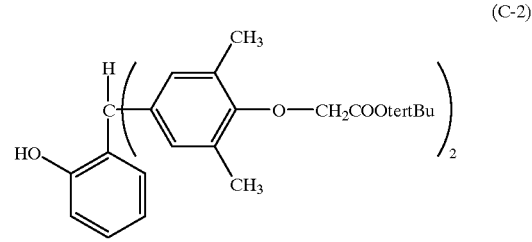

(C-2)

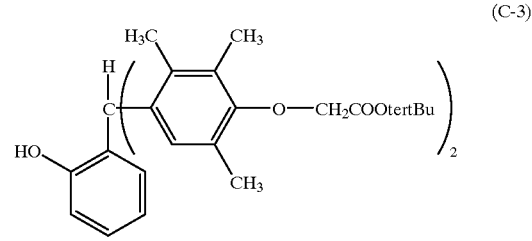

(C-3)

(C-4)
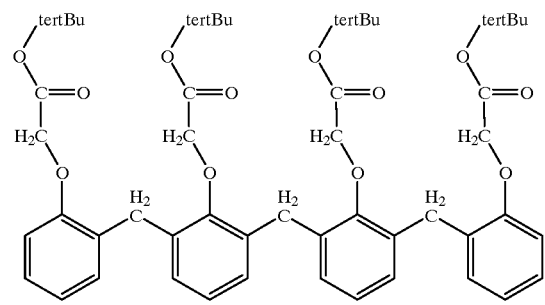

(C-5)
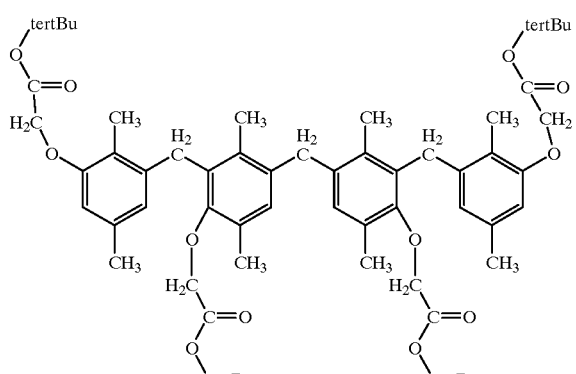

(C-6)
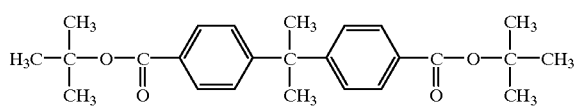

(C-7)
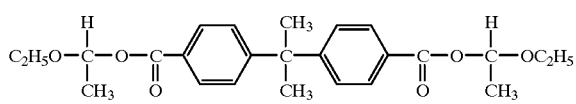

(C-8)
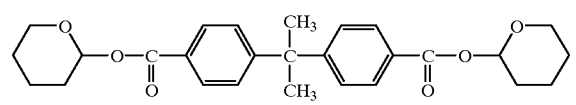

(C-9)
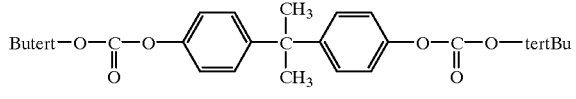

(C-10)
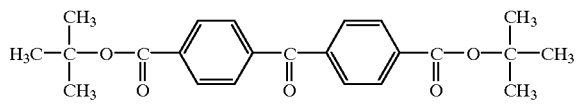

(C-11)
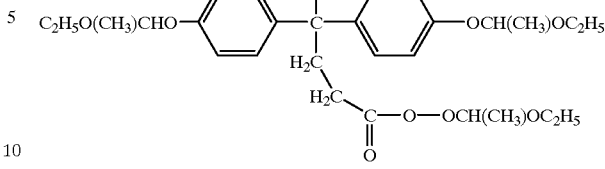

(C-12)
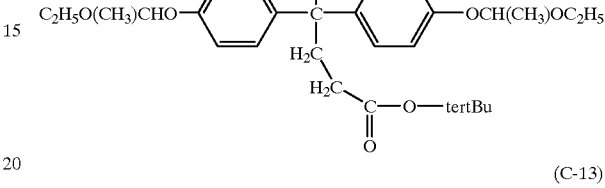

(C-13)
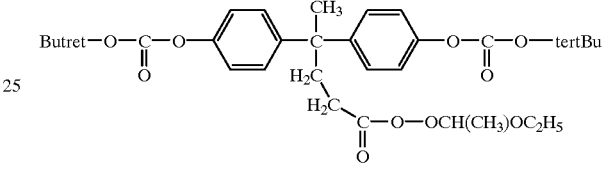

(C-14)
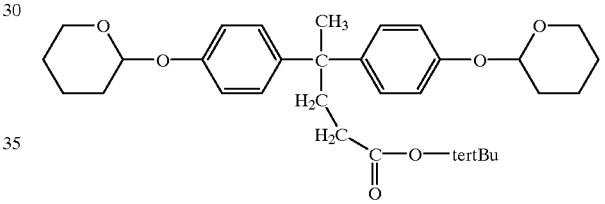

The ratio of the hydroxyl group or carboxyl group of Ingredient (C) substituted with an acid-decomposable group depends on the type of the acid-decomposable group, and is preferably equal to or more than 50%, and more preferably from about 60% to about 100% of the total hydroxyl groups or carboxyl groups in the compound. If the substitution ratio is less than 50%, the resulting resist composition exhibits low contrast and cannot form satisfactory resist patterns.

Ingredient (C) for use in the present invention can be synthetically prepared by any conventional processes. For example, Ingredient (C) can be prepared by the following process. Initially, the compound having a phenolic hydroxyl group or carboxyl group is dissolved in an organic solvent, followed by the addition of a basic catalyst and a compound corresponding to the acid-decomposable group, and the reaction at a temperature from about 20° C. to about 70° C. for about 1 to 10 hours. The resulting reaction mixture is poured into large amounts of an aqueous acid solution or water, is allowed to stand, and the organic solvent layer (upper layer) is separated and is then rinsed with several portions of an aqueous acid solution or water to thereby remove the basic catalyst and salts in the reaction mixture, followed by removal of the organic solvent under a reduced pressure to thereby yield Ingredient (C).

The organic solvent can be any solvent in which the above components are dissolved, and such organic solvents include, but are not limited to, methanol, ethanol, propanol, butanol, ethylene glycol, propylene glycol, and other alcohols; diethylene glycol dimethyl ether, propylene glycol monopropyl ether, 1,2-dimethoxyethane, 1,2-diethoxyethane, and other ethers; tetrahydrofuran, dioxane, and other cyclic ethers; acetone, methyl ethyl ketone, methyl isobutyl ketone, methyl amyl ketone, and other ketones; γ-butyrolactone, and other cyclic esters; and mixtures of these solvents.

The basic catalyst includes, but is not limited to, ethylamine, ethanolamine, diethylamine, diisopropylamine, diethanolamine, dicyclohexylamine, and other primary or secondary amines; and trimethylamine, triethylamine, tripropylamine, and other tertiary amines containing lower alkyl groups, of which triethylamine is typically preferred.

The compound corresponding to the acid-decomposable group includes, but is not limited to, di-tert-butyl dicarbonate corresponding to tert-butyloxycarbonyl group; 2,3-dihydropyran corresponding to tetrahydropyranyl group; and 1-chloro-1-ethoxyethane or ethyl vinyl ether corresponding to ethoxyethyl group.

The aqueous acid solution is preferably composed of a weak acid to avoid the decomposition of the acid-decomposable group by action of the acid, and includes an acetic aqueous acid solution.

The proportion of Ingredient (C) is preferably from 1 to 50 parts by weight, and more preferably from 10 to 30 parts by weight, relative to 100 parts by weight of Ingredient (A). If the proportion of Ingredient (C) is less than 1 part by weight, the resulting resist composition exhibits low contrast and cannot form satisfactory resist patterns. In contrast, if it exceeds 50 parts by weight, the resist composition exhibits insufficient dry etching resistance.

Additional Ingredients

The invented positive resist compositions may further comprise additives according to necessity, in addition to the aforementioned ingredients. Such additives include, for example, salicylic acid, malonic acid, and other organic carboxylic acids; and triethylamine, tributylamine, dibutylamine, triethanolamine, and other secondary or tertiary amines.

The compositional ratio of the additive is preferably from 0.01 to 5% by weight, and more preferably from 0.05 to 1% by weight relative to the weight of Ingredient (A). Within this range, the resulting resist composition has improved sensitivity and can form resist patters with good shapes.

The invented positive resist compositions may further comprise any of compatible additives including halation inhibitors and surfactants for improvement in coating performance, according necessity and within ranges not adversely affecting the advantages of the invention.

The invented positive resist compositions may be preferably used as a solution prepared by dissolving the above-specified ingredients in an appropriate solvent. Such solvents include solvents for use in conventional positive resist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers, and other polyhydric alcohols and derivatives thereof; dioxane, and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination.

Practically, the positive resist composition of the present invention may be preferably used, for example, in the following manner. Each of the ingredients is dissolved in an appropriate solvent as mentioned above to yield a coating solution; the coating solution is then applied, using a spinner or the like, onto a substrate such as a silicon wafer, and is then dried to form a photosensitive layer; next, the photosensitive layer is irradiated and is exposed with active light or radiant ray, through a patterned mask; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image (resist pattern) being in exact accordance with the mask pattern. To further improve the definition of resist pattern, an anti-reflection coating is preferably formed between the substrate and the photosensitive layer composed of the invented resist composition.

The invented positive resist compositions each comprise a resin having a polysiloxane skeleton and have satisfactory dry etching resistance. Accordingly, they can form a thin film on a substrate and are useful for the two-layer resist process. A base material carrying such a two-layer resist can further improve the definition of resist pattern.

Such base materials can be preferably prepared in the following manner. Initially, an organic polymer layer 200 to 800 nm thick as a lower resist layer is formed on a substrate such as a silicon wafer, which organic polymer can be dry-etched by $O_2$ reactive ion etching and includes novolak resins, or resists for g-line or i-line; next, the invented positive resist composition is applied on the organic polymer layer by spin coating to thereby yield an upper resist layer. The upper resist layer has a thickness of from 50 to 200 nm and preferably from 50 to 100 nm. The upper resist layer is patterned in the same manner as above, and the substrate is subjected to $O_2$ reactive ion dry etching using the patterned upper resist as a mask to thereby selectively etch the lower resist layer, forming the same resist pattern on the lower resist layer as in the upper resist layer.

In the examples below, KrF excimer laser was employed as a light source, but the invented positive resist compositions are also useful for processes using $F_2$ excimer laser (157 nm), extreme-ultraviolet rays (EUV, vacuum ultraviolet rays; 13 nm) and other light sources having wavelengths equal to or shorter than that of KrF excimer laser, and has high definition and can form resist patterns with good sectional shapes, the invented positive resist compositions are typically useful for processes using $F_2$ excimer laser as the light source.

EXAMPLES

The present invention will be illustrated in further detail with reference to several examples and a comparative example below.

Preparation Example

Ingredient (A) for use in the present invention was prepared according to the method described in Japanese Patent No. 2567984.

In a 500-ml three-neck flask equipped with a stirrer, reflux condenser, dropping funnel and thermometer, 84.0 g (1.0 mol) of sodium hydrogencarbonate and 400 ml of water were placed, and to this mixture, a mixture of 51.1 g (0.20 mol) of p-methoxybenzyltrichlorosilane, 16.9 g (0.08 mol) of phenyltrichlorosilane and 100 ml of diethyl ether was added dropwise from the dropping funnel over 2 hours, followed by aging for 1 hour. After the completion of reaction, the reaction mixture was extracted with ether, and ether was removed by distillation under a reduced pressure, and 0.2 g of a 10% by weight potassium hydroxide solution was added to the resulting hydrolysate, followed by aging at 200° C. for 2 hours, to thereby yield a copoly(p-methoxybenzylsilsesquioxane/phenylsilsesquioxane). The above-prepared copolymer was dissolved in 150 ml of acetonitrile, and to this solution, 80 g (0.40 mol) of trimethylsilyl iodide was added, followed by stirring under reflux for 24 hours, addition of 50 ml of water, and stirring under reflux for further 12 hours. After cooling, free iodine was reduced with an aqueous sodium hydrogensulfite solution, followed by separation of the organic layer and removal of the solvent by distillation under a reduced pressure, and the resulting polymer was reprecipitated with acetone and n-hexane, and was dried by heating under a reduced pressure to thereby yield a target alkali-soluble polysiloxane resin, a copolymer of the following formula having a p-hydroxybenzylsilsesquioxane unit and a phenylsilsesquioxane unit:

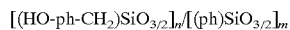

wherein n/(n+m)=0.7, m/(n+m)=0.3; and ph is a phenyl group.

Example 1

Ingredient (A): the resin obtained in Preparation Example (a copoly(p-hydroxybenzyl/phenyl-silsesquioxane) comprising a p-hydroxybenzylsilsesquioxane unit and a phenylsilsesquioxane unit in a molar ratio of 70:30 and having a weight average molecular weight of 7500)

Ingredient (B): triphenylsulfonium trifluoromethanesulfonate

Ingredient (C): the following compound (C-5)

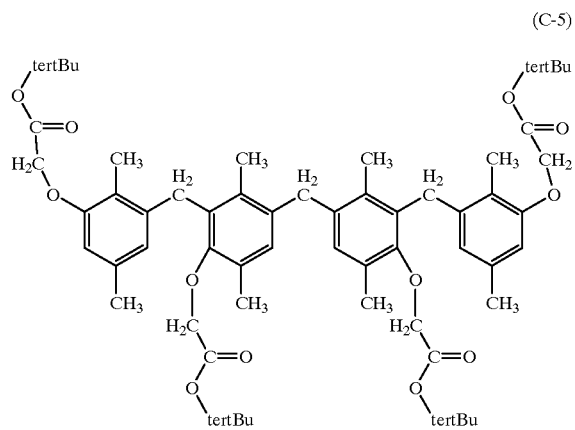

Additional Ingredient: Triethanolamine

In 1660 parts by weight of propylene glycol monomethyl ether monoacetate, 100 parts by weight of Ingredient (A), 3 parts by weight of Ingredient (B), 30 parts by weight of Ingredient (C) and 0.3 part by weight of the additional ingredient were dissolved, followed by filtration through a 0.1-$\mu$m membrane filter, to thereby yield a coating solution of a positive resist composition.

The above-prepared coating solution of positive resist composition was applied onto a 6-inch silicon wafer by spin coating, and was dried on a hot plate at 90° C. for 90 seconds to thereby form a resist layer 100 nm thick.

The resist layer was selectively irradiated with KrF excimer laser (248 nm) using a reduced type projection aligner (available from Canon Kabushiki Kaisha under the trade name of "FPA-3000EX3"), was post-exposure baked (PEB) at 110° C. for 90 seconds, followed by puddle development with a 2.38% by weight tetramethylammonium hydroxide aqueous solution at 23° C. for 60 seconds. Next, the substrate was rinsed with pure water for 30 seconds to thereby yield a positive resist pattern.

Thus, a 180-nm line-and-space pattern with a satisfactory, nearly rectangular sectional shape was obtained at an exposure of 22 mJ/cm$^2$.

Example 2

A solution of a positive resist composition was prepared in the same manner as in Example 1, except that 30 parts by weight of the following compound (C-9) was used instead of Ingredient (C) used in Example 1.

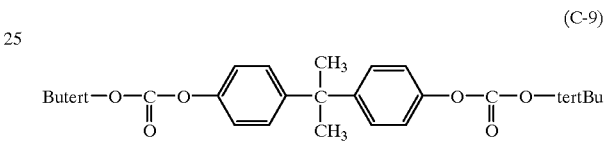

Next, a resist layer was formed and was patterned in the same manner as in Example 1, to thereby yield a 180-nm line-and-space pattern with a satisfactory, nearly rectangular sectional shape at an exposure of 20 mJ/cm$^2$.

Example 3

A solution of a positive resist composition was prepared in the same manner as in Example 1, except that 30 parts by weight of the following compound (C-10) was used instead of Ingredient (C) used in Example 1.

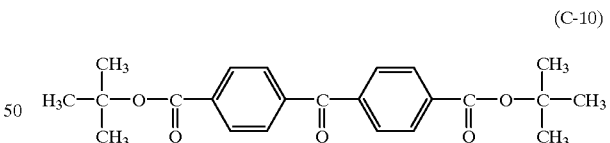

Next, a resist layer was formed and was patterned in the same manner as in Example 1, to thereby yield a 180-nm line-and-space pattern with a satisfactory, nearly rectangular sectional shape at an exposure of 22 mJ/cm$^2$.

Example 4

A solution of a positive resist composition was prepared in the same manner as in Example 1, except that 30 parts by weight of the following compound (C-1) was used instead of Ingredient (C) used in Example 1.

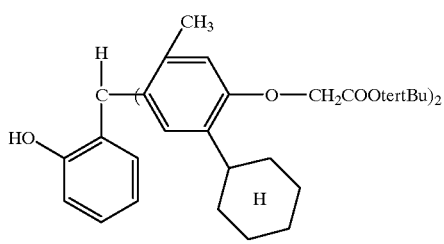

(C-1)

Next, a resist layer was formed and was patterned in the same manner as in Example 1, to thereby yield a 180-nm line-and-space pattern with a satisfactory, nearly rectangular sectional shape at an exposure of 24 mJ/CM$^2$.

Example 5

A resist for g-line (available from Tokyo Ohka Kogyo Co., Ltd., under the trade name of "OFPR-800") was applied as an under layer onto a silicon substrate by spin coating, and was baked at 200° C. for 30 minutes to thereby yield a first resist layer 640 nm thick. Separately, a resist solution was prepared in the same manner as in Example 1, except that triethanolamine was not used. The prepared resist solution was applied as an upper layer onto the first resist layer by spin coating and was pre-baked at 90° C. for 90 seconds to thereby yield a second resist layer 100 nm thick. The resulting substrate was selectively irradiated with KrF excimer layer in the same manner as in Example 1 and was post-exposure baked (PEB) at 110° C. for 90 seconds, followed by development in a 2.38% by weight tetramethylammonium hydroxide aqueous solution for 60 seconds. The substrate was then subjected to etching for 5 to 10 minutes by O$_2$ reactive ion etching (RIE) using a parallel plate type reactive ion etching system to thereby yield a 180-nm hole pattern. This hole pattern was obtained at an exposure of 52 mJ/cm$^2$ and was a positive resist pattern with a vertical sectional shape.

Comparative Example

A solution of a positive resist composition was obtained in the same manner as in Example 1, except that a copolymer comprising 40% by mole of a hydroxybenzylsilsesquioxane unit, 40% by mole of a phenylsilsesquioxane unit and 20% by mole of a tert-butoxycarbonyloxybenzylsilsesquioxane unit was used as Ingredient (A), and Ingredient (C) was not used.

Next, a resist layer was formed and was patterned in the same manner as in Example 1, only to yield a 200-nm line-and-space pattern at finest at an exposure of 25 mJ/cm$^2$.

The invention can provide a positive resist composition that is useful in processes using F$_2$ excimer laser (157 nm), extreme-ultraviolet rays (EUV, vacuum ultraviolet rays; 13 nm) and other light sources having wavelengths equal to or shorter than that of KrF excimer laser, and has high definition and can form resist patterns with good sectional shapes, as well as a base material carrying a resist layer composed of the positive resist composition.

Other embodiments and variations will be obvious to those skilled in the art, and this invention is not to be limited to the specific matters stated above.

What is claimed is:

1. A positive resist composition comprising:

(A) an alkali-soluble polysiloxane resin;

(B) an acid generator composed of a compound which generates an acid upon irradiation of active light or radiant ray; and (C) a compound in which at least one hydrogen atom of the phenolic hydroxyl group or carboxyl group of the compound is substituted with an acid-decomposable group, wherein said Ingredient (A) is an alkali-soluble polysiloxane resin comprising (a1) a siloxane unit containing an alkali-soluble group, and (a2) a siloxane unit containing an alkali-insoluble group, said alkali-insoluble group having no acid-decomposable groups, wherein said siloxane unit (a2) is a phenylsilsesquioxane unit.

2. A positive resist composition according to claim 1, wherein the alkali-soluble group of said siloxane unit (a1) is at least one of hydroxyl group and carboxyl group.

3. A positive resist composition according to claim 2, wherein, in said siloxane unit (a1), the alkali-soluble group is bonded to the silicon atom of a siloxane group through at least one group selected from the group consisting of alkylene groups, cycloalkylene groups and aralkylene groups.

4. A positive resist composition according to claim 3, wherein said siloxane unit (a1) is a hydroxybenzylsilsesquioxane unit.

5. A positive resist composition according to claim 1, wherein said Ingredient (C) is a compound in which at least one hydrogen atom of the hydroxyl group or carboxyl group of a compound of following Formula (I) is substituted with an acid-decomposable group, said acid decomposable group being selected from the group consisting of tertiary-alkyloxycarbonyl-substituted alkyl groups, tertiary-alkyloxycarbonyl groups, tertiary-alkyl groups, cyclic ether groups and alkoxy-substituted alkyl groups:

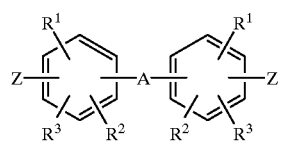

(I)

wherein Z is a hydroxyl group or a carboxyl group; each of $R^1$, $R^2$ and $R^3$ is independently a hydrogen atom, a hydroxyl group, a halogen atom, an alkoxy group having from 1 to 5 carbon atoms, or a linear, branched or cyclic alkyl group having from 1 to 6 carbon atoms; A is a single bond or a divalent organic group selected from the group consisting of alkylene groups each having from 1 to 5 carbon atoms, alkylidene groups each having from 2 to 5 carbon atoms, alkylene groups each having from 1 to 5 carbon atoms and further having a carboxyl group, alkylidene groups each having from 2 to 5 carbon atoms and further having a carboxyl group, a carbonyl group, and groups of the following formulae:

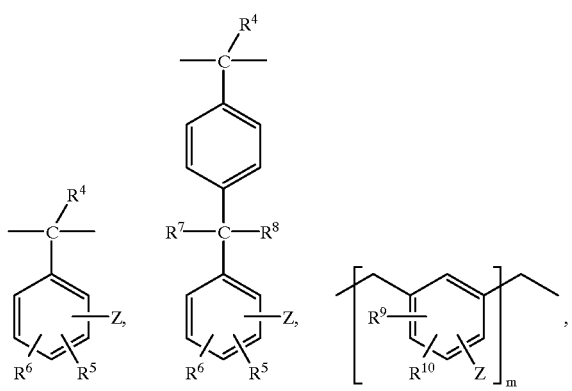

$R^4$ is a hydrogen atom or an alkyl group having from 1 to 5 carbon atoms; each of $R^5$ and $R^6$ is independently a hydrogen atom, a halogen atom, a hydroxyl group, an alkyl group having from 1 to 5 carbon atoms, or an alkoxy group having from 1 to 5 carbon atoms; each of $R^7$ and $R^8$ is independently an alkyl group having from 1 to 5 carbon atoms; each of $R^9$ and $R^{10}$ is independently a hydrogen atom, a hydroxyl group or an alkyl group having from 1 to 5 carbon atoms; and m denotes an integer from 1 to 6.

6. A positive resist composition according to claim 5, wherein said acid-decomposable group is at least one selected from the group consisting of tert-butyloxycarbonylmethyl group, tert-butyloxycarbonyl group, tert-butyl group, tetrahydrofuranyl group, tetrahydropyranyl group, ethoxyethyl group and methoxypropyl group.

7. A base material comprising:
an organic polymer layer as a first layer formed on a substrate; and
a second resist layer formed on said organic polymer layer, said second resist layer being composed of a positive composition and having a thickness of from 50 to 200 nm, said positive composition comprising:
(A) an alkali-soluble polysiloxane resin;
(B) an acid generator composed of a compound which generates an acid upon irradiation of active light or radiant ray; and
(C) a compound in which at least one hydrogen atom of the phenolic hydroxyl group or carboxyl group of the compound is substituted with an acid-decomposable group,
wherein said Ingredient (A) is an alkali-soluble polysiloxane resin comprising (a1) a siloxane unit containing an alkali-soluble group, and (a2) a siloxane unit containing an alkali-insoluble group, said alkali-insoluble group having no acid-decomposable group.

8. A base material according to claim 7, wherein the alkali-soluble group of said siloxane unit (a1) is at least one of hydroxyl group and carboxyl group.

9. A base material according to claim 8, wherein, in said siloxane unit (a1), the alkali-soluble group is bonded to the silicon atom of a siloxane group through at least one group selected from the group consisting of alkylene groups, cycloalkylene groups and aralkylene groups.

10. A base material according to claim 9, wherein said siloxane unit (a1) is a hydroxybenzylsilsesquioxane unit.

11. A base material according to claim 7, wherein said alkali-insoluble group having no acid-decomposable group of said siloxane unit (a2) is at least one selected from the group consisting of alkyl groups, cycloalkyl groups, aryl groups and aralkyl groups.

12. A base material according to claim 11, wherein said siloxane unit (a2) is a phenylsilsesquioxane unit.

13. A base material according to claim 7, wherein said Ingredient (C) is a compound in which at least one hydrogen atom of the hydroxyl group or carboxyl group of a compound of following Formula (I) is substituted with an acid-decomposable group, said acid decomposable group being selected from the group consisting of tertiary-alkyloxycarbonyl-substituted alkyl groups, tertiary-alkyloxycarbonyl groups, tertiary-alkyl groups, cyclic ether groups and alkoxy-substituted alkyl groups:

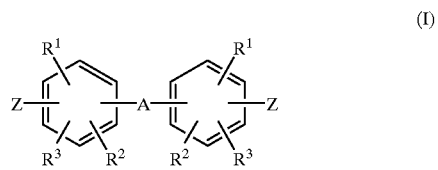

(I)

wherein Z is a hydroxyl group or a carboxyl group; each of $R^1$, $R^2$ and $R^3$ is independently a hydrogen atom, a hydroxyl group, a halogen atom, an alkoxy group having from 1 to 5 carbon atoms, or a linear, branched or cyclic alkyl group having from 1 to 6 carbon atoms; A is a single bond or a divalent organic group selected from the group consisting of alkylene groups each having from 1 to 5 carbon atoms, alkylidene groups each having from 2 to 5 carbon atoms, alkylene groups each having from 1 to 5 carbon atoms and further having a carboxyl group, alkylidene groups each having from 2 to 5 carbon atoms and further having a carboxyl group, a carbonyl group, and groups of the following formulae:

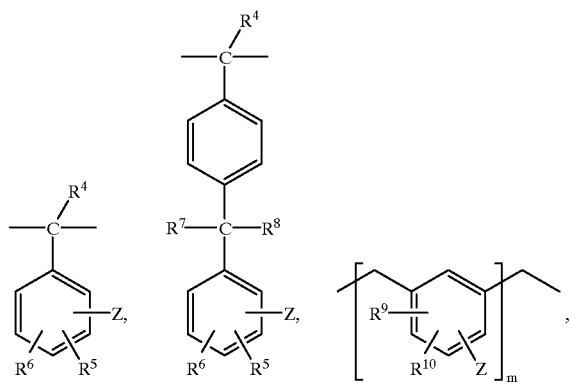

$R^4$ is a hydrogen atom or an alkyl group having from 1 to 5 carbon atoms; each of $R^5$ and $R^6$ is independently a hydrogen atom, a halogen atom, a hydroxyl group, an alkyl group having from 1 to 5 carbon atoms, or an alkoxy group having from 1 to 5 carbon atoms; each of $R^7$ and $R^8$ is independently an alkyl group having from 1 to 5 carbon atoms; each of $R^9$ and $R^{10}$ is independently a hydrogen atom, a hydroxyl group or an alkyl group having from 1 to 5 carbon atoms; and m denotes an integer from 1 to 6.

14. A base material according to claim 13, wherein said acid-decomposable group is at least one selected from the group consisting of tert-butyloxycarbonylmethyl group, tert-butyloxycarbonyl group, tert-butyl group, tetrahydrofuranyl group, tetrahydropyranyl group, ethoxyethyl group and methoxypropyl group.

* * * * *